United States Patent [19]

Suzuki

[11] Patent Number: 5,001,345
[45] Date of Patent: Mar. 19, 1991

[54] TRANSMISSION ELECTRON MICROSCOPE
[75] Inventor: Seiichi Suzuki, Tokyo, Japan
[73] Assignee: JEOL, Ltd., Tokyo, Japan
[21] Appl. No.: 442,111
[22] Filed: Nov. 28, 1989
[30] Foreign Application Priority Data Dec. 2, 1988 [JP] Japan .............................. 63-305812

[51] Int. Cl.⁵ .............................................. H01J 37/26
[52] U.S. Cl. ...................................... 250/311; 250/306
[58] Field of Search ......................... 250/311, 306, 307

[56] References Cited
U.S. PATENT DOCUMENTS

| | | | |
|---|---|---|---|
| 2,443,107 | 6/1948 | Hillier | 250/307 |
| 2,606,292 | 8/1952 | Columbe | 250/307 |
| 3,225,192 | 12/1965 | Katagiri et al. | 250/311 |
| 3,571,590 | 3/1971 | Katagiri et al. | 250/311 |
| 4,520,264 | 5/1985 | Tsuno et al. | 250/311 |
| 4,775,790 | 10/1988 | Kobayashi et al. | 250/311 |

Primary Examiner—Bruce C. Anderson
Attorney, Agent, or Firm—Webb, Burden, Ziesenheim & Webb

[57] ABSTRACT

A transmission electron microscope including an input portion such as a keyboard, a central processing unit (CPU), two memories connected with the CPU, an imaging lens system, and a lens control portion connected with the CPU. The imaging lens system comprises an objective lens, intermediate lenses, and a projector lens. The microscope can operate either in image mode or in diffraction mode. In the image mode, excitation currents fed to the lenses can be controlled to rotate the image projected onto the fluorescent screen. In the diffraction mode, the excitation currents are controlled according to data about the orientation of the image so that the projected diffraction pattern may substantially coincide in orientation with the image.

4 Claims, 2 Drawing Sheets

TRANSMISSION ELECTRON MICROSCOPE

FIELD OF THE INVENTION

The present invention relates to a transmission electron microscope and, more particularly, to a transmission electron microscope which is designed to rotate the specimen image by controlling electric currents supplied to the lenses of the imaging lens system consisting of an objective lens, intermediate lenses, and a projector lens.

BACKGROUND OF THE INVENTION

Generally, when a specimen is observed on a transmission electron microscope, an image or diffraction pattern of the specimen is projected onto the fluorescent screen, or a specimen image is observed, analyzed, or otherwise processed after such an image or diffraction pattern is recorded on a recording medium such as photographic film. For example, U.S. Pat. No. 4,520,264 discloses an electron microscope which permits the operator to rotate the electron micrograph of a specimen at will so that he or she can most easily observe it. For this purpose, electric currents supplied to the lenses of the imaging lens system are controlled.

In a conventional electron microscope of this construction, the imaging lens system consisting of an objective lens, at least two intermediate lenses, and a projector lens forms the final image either on the fluorescent screen or on a photographic plate. Usually, all of these lenses are of the electromagnetic type and so the final image on the fluorescent screen is rotated through an angle $\theta$ about the optical axis of the imaging lens system relative to the specimen. This angle $\theta$ is called the rotational angle and given by $$\theta = (e/8mVr)^{\frac{1}{2}} \int_{Zs}^{Ze} Bz \cdot dz \quad (1)$$

where e is the charge of an electron, m is the rest mass of an electron, Vr is the accelerating voltage acting on the electron beam and corrected for relativistic effects, Bz is the intensity of the magnetic field along the optical axis Z of the imaging lens system, Zs is the position of the specimen on the optical axis, and Ze is the position of the final image on the optical axis. In the above equation, the term $(e/8mVr)^{\frac{1}{2}}$ has a constant value. The value obtained by integrating Bz from Zs to Ze is equal to the total excitation current fed to the electromagnetic lenses disposed between the specimen and the final image. The total excitation current gives rise to a magnetomotive force represented in ampere-turns (NI).

In the aforementioned electron microscope, the specimen image projected on the fluorescent screen is so rotated that the portion of the image of interest can be most easily observed. In this condition, the image is photographed. Then, a diffraction pattern of the portion of interest is projected onto the fluorescent screen and photographed. During the projection of the diffraction pattern, the lenses are excited in a manner different from when the specimen image is projected. Therefore, the diffraction pattern is projected independent of the rotation of the specimen image projected heretofore. A specimen having a known crystal orientation is used where the crystal orientation is observed or analyzed while comparing the photograph of the specimen image with the previously taken photograph of the diffraction pattern. The difference in orientation between the specimen image and the diffraction pattern is measured in practice. During the observation, the image and the diffraction pattern are made coincident with each other in orientation. This series of operations is very cumbersome to perform and involves inaccuracies.

SUMMARY OF THE INVENTION

In view of the foregoing problems, it is an object of the present invention to provide a transmission electron microscope which controls electric currents fed to the lenses of the imaging lens system in the diffraction mode to make the projected diffraction pattern coincident in orientation with the specimen image or to provide a display of the difference in orientation between the image and the diffraction pattern.

The above object is achieved by a transmission electron microscope capable of operating either in an image mode, in which an electron microscope image of a specimen is projected onto the fluorescent screen and electric currents fed to the lenses of the imaging lens system can be controlled to rotate the image, or in a diffraction mode, in which a diffraction pattern of the specimen is projected onto the screen and the electric currents fed to the lenses are controlled according to information indicating the orientation of the specimen image to make the diffraction pattern substantially coincident with the specimen image in orientation.

Preferably, according to this invention, a transmission electron microscope comprises an electron gun and a condenser lens system for focusing an electron beam upon a specimen. It further comprises an imaging lens system having a plurality of lenses for projecting the electron beam transmitted through the specimen upon a device for displaying or capturing an image of the electron beam projected thereon. A lens control circuit, in response to input data sets, controls the exciting current supplied to each lens in the imaging lens system. A first memory stores sets of data. Each set defines individual currents applied to the lenses in the imaging lens system to provide a given image magnification and each set corresponds to a total ampere-turns for all lenses in the imaging lens system and thereby a selected image rotation. A second memory stores different sets of data. Each data set in the second memory defines individual currents applied to the lenses in the imaging lens system to provide a diffraction pattern at a given distance from the specimen to the image display or capture device and each set corresponds to a total ampere-turns for all lenses in the imaging lens system and also to a total in the data sets stored in said first memory. A computer applies data sets from said first and second memories to the lens control circuit at different times to cause either a transmission electron image or diffraction pattern at said display or capture device so that a projected diffraction pattern may substantially coincide in orientation with a transmission electron image.

Other objects and features of the invention will appear in the course of the description thereof which follows.

DETAILED DESCRIPTION OF THE INVENTION

Figure 1:
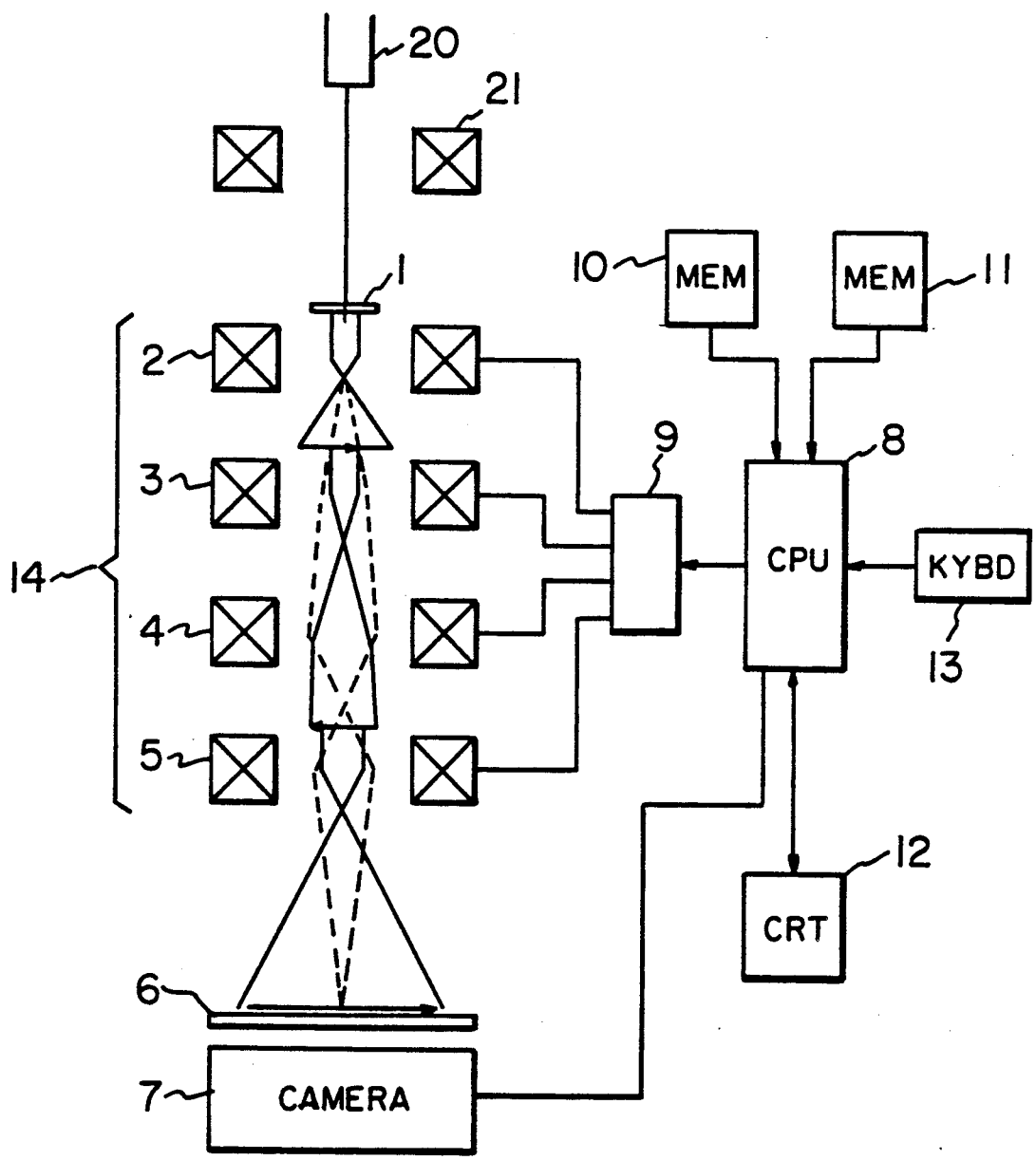
FIG. 1 is a block diagram of main portions of a transmission electron microscope according to the invention.

Referring to FIG. 1, there is shown a transmission electron microscope embodying the concept of the present invention. The microscope includes an imaging lens system 14, a fluorescent screen 6, a camera 7, a central processing unit (CPU) 8, lens control portion 9, memories 10 and 11, a display unit 12, and an input portion 13 such as a keyboard. The electron gun 20 and the condenser lenses 21 focus an electron beam upon the specimen. A specimen 1 is placed above the imaging lens system 14 which consists of an objective lens 2, intermediate lenses 3, 4, and a projector lens 5. The input portion 13, the memories 10, 11, the lens control portion 9, the camera 7, and the display unit 12 are all connected with the CPU 8. The magnification and the orientation of the specimen image are set by operating the input portion 13. The operation mode of the microscope can be switched between an image mode and a diffraction mode by operating the input portion 13.

The orbit that the electron beam follows in the image mode is indicated by the solid lines in FIG. 1. The orbit followed in the diffraction mode is indicated by the broken lines.

The angle $\theta$ through which the image is rotated by the imaging lens system is defined by equation (1) above. This equation holds in the diffraction mode, as well as in the image mode. That is, the orientation of the diffraction pattern can be changed at will by varying the total ampere-turns of the imaging lens system. The orientation of the diffraction pattern is made to agree with the orientation of the electron micrograph, by making the total ampere-turns of the imaging lens system in the diffraction mode NI (dif.) equal to the total ampere-turns of the imaging lens system in the image mode NI (image).

In case a virtual image is formed in the middle of the imaging lens system, the angle $\theta$ through which the image is rotated by the imaging lens system becomes larger or smaller by 180° than the angle defined by the equation (1) above. Accordingly, in this case, in order to agree the orientation of the diffraction pattern with the orientation of the electron microscope image, the additional rotation angle of 180° owing to appearance of the virtual image should be taken into consideration. Namely, the following equation should be satisfied in such case.

$$NI(dif.) = NI(image) + NI(180°) \quad (2)$$

where, NI(180°) is the ampere turns of the imaging lens system for rotating the image or the diffraction pattern by 180°.

Figure 2:
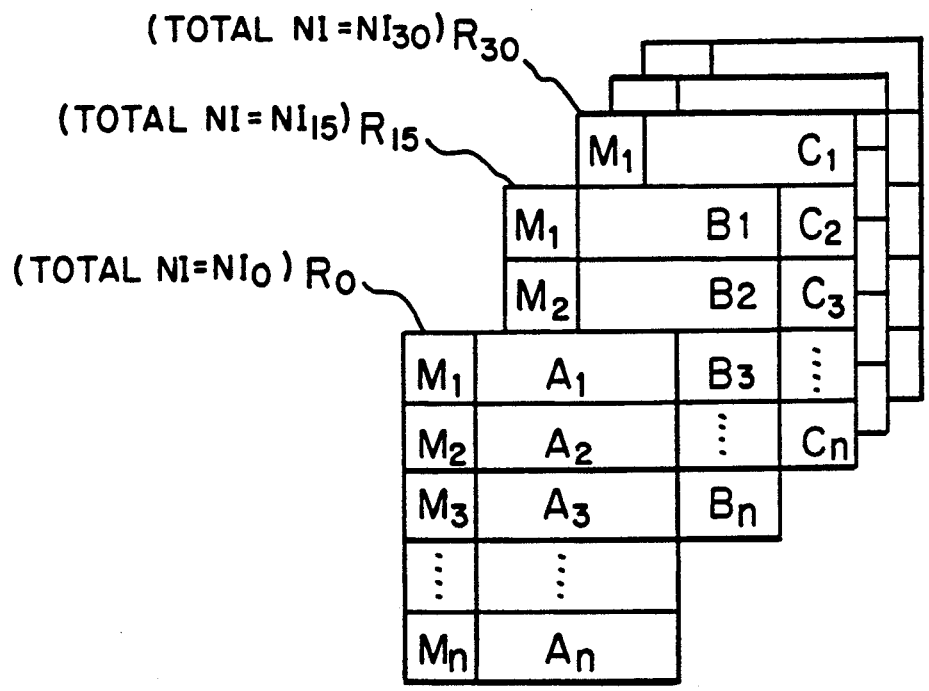
FIGS. 2 and 3 are diagrams illustrating the tables stored in memories shown in FIG. 1.
Figure 3:
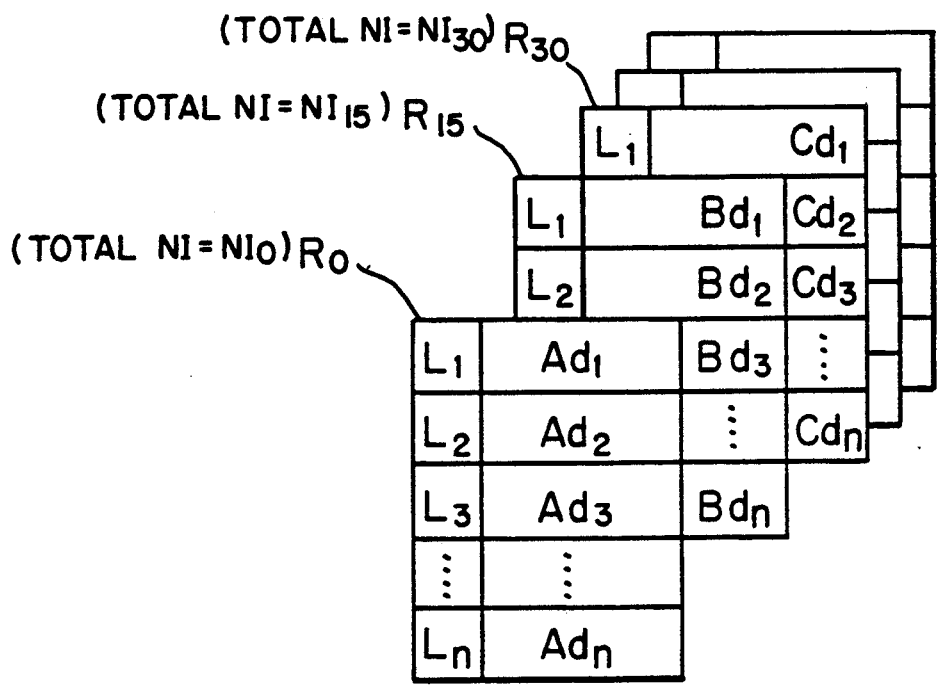

Those various combinations of excitation currents fed to the lenses of the imaging lens system which achieve the above agreement have been obtained by calculation or experiments. Tables of these combinations are stored in memories 10 and 11. More specifically, each table stored in the memory 10 consists of numerous sets of excitation currents ($A_1$-$A_n$) fed to the lenses as shown in FIG. 2. These sets of currents ($A_1$-$A_n$) attain magnifications $M_1$-$M_n$, respectively, in the image mode. In this example, the electron micrograph is caused to rotate a discrete step angle of 15°. Correspondingly, plural tables $R_0$, $R_{15}$, $R_{30}$, and so on are stored in the memory 10. Each table stored in the memory 11 consists of numerous sets of excitation currents ($Ad_1$-$Ad_n$) fed to the lenses in the diffraction mode as shown in FIG. 3. These sets of currents ($Ad_1$-$Ad_n$) realize camera lengths $L_1$-$L_n$, respectively, in the diffraction mode. Plural tables $R_0$, $R_{15}$, $R_{30}$, and so on are stored in the memory 11, corresponding to the discrete step angle 15° of the electron micrograph.

When an electron micrograph is observed on the fluorescent screen, the input portion 13 is operated to select the image mode. Then, the operator sets a desired magnification and a desired rotational angle through the use of the input portion 13. Let us assume that the operator enters a magnification $M_2$ and a rotational angle of 0° by operating the input portion 13. The CPU 8 selects the table $R_0$ from the numerous tables stored in the memory 10, corresponding to the angle 0°. Then the CPU 8 selects data about one set of excitation currents ($A_2$) fed to the imaging lens system, corresponding to the magnification $M_2$. The imaging lens system includes the intermediate lenses and the projector lenses. The data read from the memory 10 in this way under the control of the CPU 8 is routed to the lens control portion 9, which then supplies excitation currents corresponding to its input data to the lenses.

When the electron microscope image projected onto the fluorescent screen is rotated through a desired angle without changing the magnification, this angle is entered from the input portion 13. If this angle is 15°, then the CPU 8 selects a table $R_{15}$ from the tables stored in the memory 10, corresponding to angle 15°. The CPU 8 selects data about one set of excitation currents ($B_2$) fed to the lenses out of the table $R_{15}$, corresponding to the specified magnification $M_2$. The data read out in this way is supplied to the lens control portion 9, which supplies excitation currents to the lenses according to the data ($B_2$). As a result, an electron microscope image which is magnified at magnification $M_2$ and rotated through 15° is projected onto the fluorescent screen. At this time, data about the rotational angle 15° of the image and data regarding the magnification $M_2$ are furnished to the display unit 12 so that they are displayed numerically or graphically on the unit.

When a diffraction pattern of the electron optical image is observed on the fluorescent screen, the input portion 13 is operated to select the diffraction mode. Then, the CPU 8 selects a table $R_{15}$ from the tables stored in the memory 11, according to the information about the rotational angle 15° and the magnification $M_2$ presented on the display unit. The CPU then selects data ($Bd_2$) about a set of excitation currents fed to the intermediate lenses, the projector lens, etc. of the imaging lens system, the set of excitation currents causing the diffraction pattern of the electron beam transmitted through the specimen to be projected onto the fluorescent screen at a camera length $L_2$ corresponding to the specified magnification $M_2$. The data ($Bd_2$) is sent to the lens control portion 9, which supplies the aforementioned excitation currents to the lenses according to the data. The result is that a diffraction pattern rotated through 15° similarly to the aforementioned rotation of the micrograph is projected at the specified camera length $L_2$. Data concerning the image, the diffraction pattern, the magnification, and the camera length is sent to the display unit 12 on which they are displayed numerically or graphically.

While a preferred embodiment has been described, it will be understood that various modifications may be made therein. In the above example, information indicating rotational angle of an image of a specimen has been previously stored in a memory. Alternatively, the total ampere-turns of the imaging lens system is measured, and the currents fed to the lenses of the imaging lens system in the diffraction mode is controlled so that the obtained ampere-turns equals the measured value, to make the orientation of the projected diffraction pattern coincident with the orientation of the specimen image.

As can be seen from the description made thus far, the operation mode of the novel transmission electron microscope can be switched between the image mode in which an image of the specimen is projected onto the fluorescent screen and the diffraction mode in which a diffraction pattern of the specimen is projected onto the screen. In the image mode, electric currents supplied to the lenses of the imaging lens system are controlled to rotate the image. This microscope is characterized in that a means is provided to control the electric currents fed to the lenses of the imaging lens system in the diffraction mode according to information indicating the orientation of the image so that the projected diffraction pattern may substantially coincide in orientation with the image. Therefore, if there is a rotation of the image, the effect of the rotation is canceled in the diffraction mode. Consequently, when an electron micrograph and a diffraction pattern are photographed, it is not necessary to make any alignment.

Having thus described my invention with the details and particularity required by the Patent Laws, what is claimed and desired to be protected by Letters Patent is set forth in the following claims.

What is claimed is:

1. A transmission electron microscope whose operation mode can be switched between an image mode, in which an electron microscope image of a specimen is projected onto a fluorescent screen and can be rotated by controlling electric currents fed to the lenses of the imaging lens system, and a diffraction mode, in which a diffraction pattern of the specimen is projected onto the screen and can be rotated by controlling the electric currents fed to the lenses of the imaging lens system, said electron microscope being equipped with the means that controls the electric currents fed to the lenses in the diffraction mode according to information indicating the orientation of the image of the specimen so that the projected diffraction pattern may substantially coincide in orientation with the image.

2. The transmission electron microscope of claim 1, wherein said means for controlling said electric currents comprises an input portion, a computer connected with the input portion, two memories connected with the computer, and a lens control portion that supplies said electric currents to the lenses, the lens control portion being connected with the computer.

3. The transmission electron microscope of claim 2, wherein one of the memories stores data about the relation of magnification values to various values of said electric currents in the diffraction mode, while the other memory stores data about the relations of camera length values to various values of the electric currents in the diffraction mode.

4. In a transmission electron microscope comprising an electron gun and a condenser lens system for focusing an electron beam upon a specimen and an imaging lens system comprising a plurality of lenses for projecting the electron beam transmitted through the specimen upon means for displaying or capturing an image of the electron beam projected thereon the improvement comprising:

means in response to input data sets for controlling the exciting current supplied to each lens in the imaging lens system, first information storage means for storing sets of data, each set defining individual currents applied to the lenses in the imaging lens system to provide a given image magnification, each set corresponding to a total ampere-turns for all lenses in the imaging lens system and a selected image rotation, second information storage means for storing sets of data each data set defining individual currents applied to the lenses in the imaging lens system to provide a diffraction pattern at a given distance from the specimen to the image display or capture means, each set corresponding to a total ampere-turns for all lenses in the imaging lens system and to a total in the data sets stored in said first information storage means, means for applying data sets from said first and second information storage means to said controlling means to at different times cause a transmission electron image and diffraction pattern at said display or capture means so that a projected diffraction pattern may substantially coincide in orientation with a transmission electron image.

* * * * *